(12) United States Patent
Bender et al.

(10) Patent No.: US 12,374,726 B2
(45) Date of Patent: Jul. 29, 2025

(54) BATTERY MANAGEMENT SYSTEM WITH STATE OF POWER PREDICTION FOR AN ACCUMULATOR

(71) Applicant: FEV Europe GmbH, Aachen (DE)

(72) Inventors: Tim Bender, Kaarst (DE); Giovanni Vagnoni, Aachen (DE); Seyedmehdi Hosseininasab, Aachen (DE); Tobias Gierlichs, Augsburg (DE); Christian Wesseling, Cologne (DE)

(73) Assignee: FEV Europe GmbH, Aachen (DE)

( * ) Notice: Subject to any disclaimer, the term of this patent is extended or adjusted under 35 U.S.C. 154(b) by 564 days.

(21) Appl. No.: 17/943,456

(22) Filed: Sep. 13, 2022

(65) Prior Publication Data

US 2023/0081178 A1   Mar. 16, 2023

(30) Foreign Application Priority Data

Sep. 13, 2021 (DE) .......................... 102021004618.8

(51) Int. Cl.
  *H01M 10/42*   (2006.01)
  *B60L 58/10*   (2019.01)
  *H02J 7/00*   (2006.01)
(52) U.S. Cl.
  CPC ........... *H01M 10/425* (2013.01); *B60L 58/10* (2019.02); *B60L 2240/547* (2013.01); *B60L 2240/549* (2013.01); *H01M 2010/4271* (2013.01); *H01M 2220/20* (2013.01); *H02J 7/0048* (2020.01)

(58) Field of Classification Search
  CPC ....... H01M 10/425; H01M 2010/4271; H01M 2220/20; B60L 58/10; H02J 7/0048
  USPC .......................................... 320/136
  See application file for complete search history.

(56) References Cited

U.S. PATENT DOCUMENTS 10,564,222 B2 * 2/2020 Pajovic ................ G01R 31/367
2017/0288414 A1 * 10/2017 Klein ..................... B60L 58/16

FOREIGN PATENT DOCUMENTS

DE    102020007743    3/2021

* cited by examiner

*Primary Examiner* — Nathaniel R Pelton
(74) *Attorney, Agent, or Firm* — Burris Law, PLLC

(57) ABSTRACT

A battery management system with state of power prediction for an accumulator based on a calculated current of the accumulator, a method and a control device are provided. The battery management system for an accumulator is configured and arranged to predict a state of power of the accumulator, the prediction being based on a calculated current of the accumulator.

8 Claims, 2 Drawing Sheets

BATTERY MANAGEMENT SYSTEM WITH STATE OF POWER PREDICTION FOR AN ACCUMULATOR

CROSS-REFERENCE TO RELATED APPLICATIONS

Figure 1:
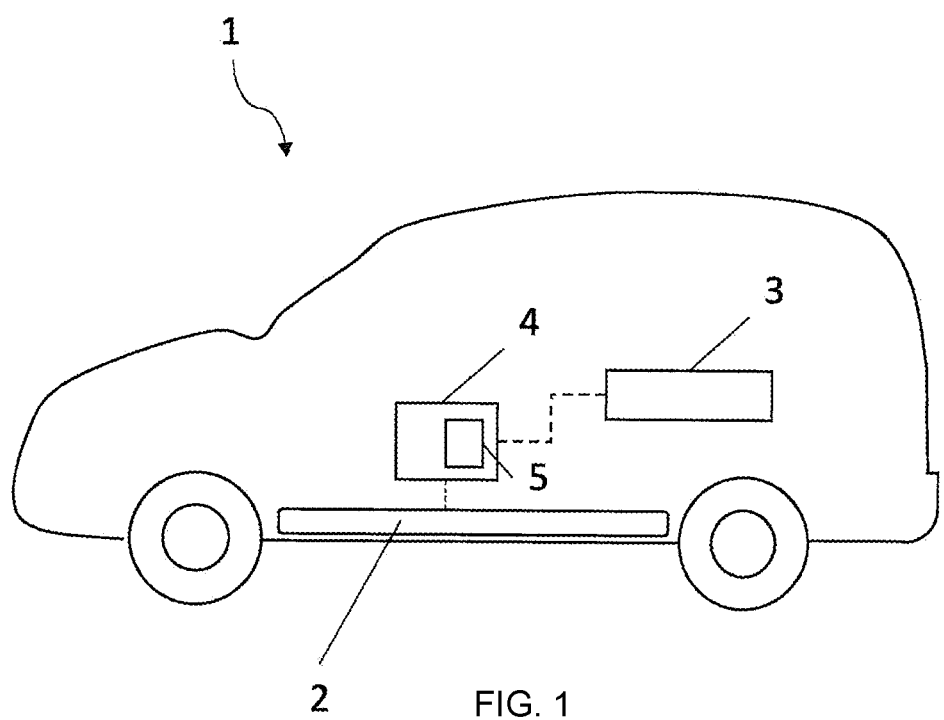

This application claims priority to and the benefit of German Patent Application Number 102021004618.8 filed on Sep. 13, 2021. The disclosure of the above application is incorporated herein by reference.

FIELD

The present disclosure relates to a battery management system with state of power prediction for an accumulator, a method and a control device.

BACKGROUND

The statements in this section merely provide background information related to the present disclosure and may not constitute prior art.

From DE 10202000774.3, a battery management system is known that is configured and arranged to determine a battery state by means of a single-particle battery model parameterized with a specific battery internal resistance $R_{opt}$ and a specific battery model angular frequency $\omega_{opt}$.

SUMMARY

This section provides a general summary of the disclosure and is not a comprehensive disclosure of its full scope or all of its features.

The battery management system for an accumulator according to the present disclosure is configured and arranged to predict a state of power of the accumulator, the prediction being based on a calculated current of the accumulator.

Since the battery management system is configured and arranged to predict the state of power of the accumulator based on the calculated current, the battery management system of the present disclosure allows a power flow to be advantageously adjusted and battery operation to be optimized.

A battery management system is understood here as a measure, in particular an electronic circuit, for monitoring, controlling, regulating and/or protecting an accumulator. In particular, a battery management system of a vehicle is considered here, which additionally serves as an interface between the vehicle and electronic components installed in the accumulator.

An accumulator is understood here as a rechargeable galvanic element consisting of two electrodes and an electrolyte, which stores electrical energy on an electrochemical basis. In particular, an accumulator is understood here to be a traction battery of a vehicle.

Preferably, the battery management system is configured and arranged to use an inverted single-particle model to calculate the current.

Since the battery management system is configured and arranged to use an inverted single-particle model to calculate the current, the battery management system of the present disclosure allows the current to be calculated dynamically during operation of the accumulator. Thus, the battery management system of the present disclosure has the advantage of predicting the state of power based on the dynamically determined current, thereby allowing for characteristics of the accumulator, which change during operation and are thus subject to a history, to be taken into account.

Preferably, the battery management system is configured and arranged to use an inverted and simplified single-particle model to calculate the current. This can reduce a calculation effort so that computing time and/or capacities can be reduced and/or used more efficiently.

Preferably, the battery management system is configured and arranged to iteratively solve the inverted single-particle model to calculate the current.

As the battery management system is configured and arranged to iteratively solve the inverted single-particle model, the invention allows to account for characteristics that change over time, such as a diffusion coefficient. In particular, intervals for iterating can be adjusted to achieve advantageous accuracy with the most efficient computation times possible.

Preferably, the battery management system is configured and arranged to use a voltage and a pulse width as inputs to the inverted single-particle model.

Since the battery management system is configured and arranged to use a voltage and a pulse length as inputs for the inverted single-particle model, the invention enables dynamic prediction of the state of power of the accumulator for the given voltage and pulse length. Preferably, the battery management system is configured and arranged to consider a current direction as an additional input when predicting.

The method according to the present invention for predicting a state of power of an accumulator, comprises the steps: calculating a diffusion factor; calculating a current based on an inverted single-particle model; verifying the calculated current; updating parameters of the inverted single-particle model; and repeating the steps of calculating and verifying if the step of verifying indicates that recalculation of the current is required.

By repeating the steps of calculating and verifying in order to predict the state of power, if the step of verifying indicates that recalculation of the current is required, the method of the present disclosure enables a desired accuracy of the calculated current to be achieved.

Desired accuracy means here that a number of iterations is selected in such a way that on the one hand the highest possible accuracy can be achieved, but on the other hand the computational effort is not too high. A maximum accuracy is limited by an available computing time and/or capacity as well as an accuracy of the used single particle model and/or a used algorithm.

Preferably, a number of iterations is dependent on the pulse length. Particularly preferably, verifying the calculated current includes taking the pulse length into account so that the calculated current is valid if the pulse length does not exceed a time span of one iteration.

Parameters here are understood to be, in particular, input parameters of the inverted single-particle model. Preferably, the input parameters here are a difference $\Delta SOC$ between an actual state of charge of the accumulator and a maximum or minimum state of charge and the diffusion factor.

The control device according to the present disclosure for controlling a power flow of an accumulator is provided. The control device is configured and arranged to control the power flow based on a predicted state of power, and is configured and arranged to determine the predicted state of power based on the method according to the present disclosure or to use the state of power predicted by the battery management system according to the present disclosure.

By having the controller control the power flow based on the predicted state of power, the invention allows the current state of the accumulator to be taken into account when controlling the power flow.

In this context, controlling is understood as controlling with an open or temporarily closed action path as well as controlling with a closed action path.

The dependent claims describe further advantageous embodiments of the present disclosure.

Preferred embodiments are explained in more detail with reference to the following figures.

Further areas of applicability will become apparent from the description provided herein. It should be understood that the description and specific examples are intended for purposes of illustration only and are not intended to limit the scope of the present disclosure.

DRAWINGS

Figure 2:
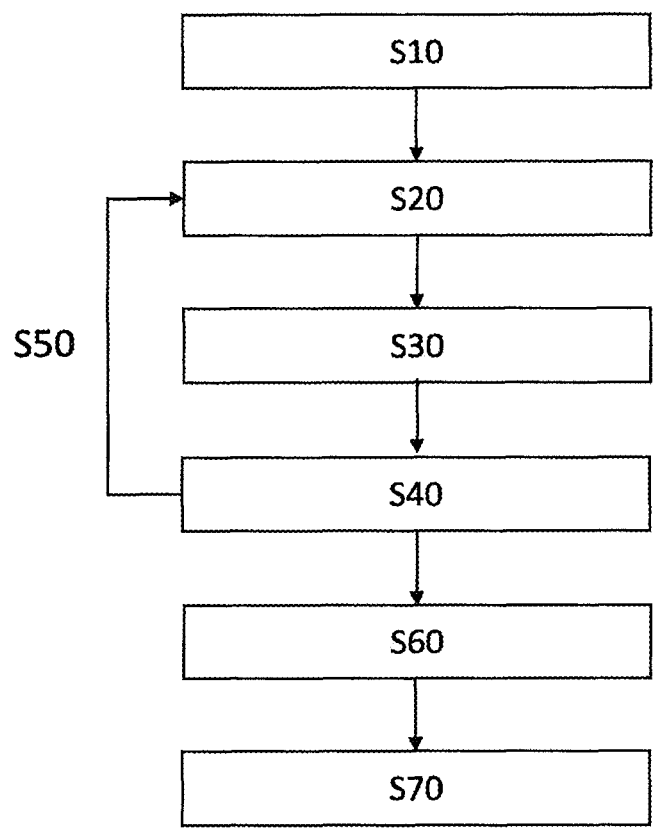

In order that the disclosure may be well understood, there will now be described various forms thereof, given by way of example, reference being made to the accompanying drawings, in which:

FIG. 1 shows an embodiment of a vehicle with a control unit for predicting a state of power of an accumulator; and FIG. 2 shows an embodiment example of steps performed by a battery management system for predicting a state of power of an accumulator.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 shows an at least partially electrified vehicle 1 with an accumulator configured as a traction battery 2 and a control unit configured as a vehicle control unit 3 (VCU). The traction battery 2 in this case is a lithium-ion accumulator configured as an NMC accumulator.

The VCU 3 is configured and arranged to detect a load request from a vehicle driver, but also sensor signals from brakes, and to control a power flow in the vehicle 1 based on the detected information. Controlling the power flow includes providing torque to the wheels and controlling an electric motor, the traction battery 2 and a charging system.

The VCU 3 is configured and arranged to control the power flow based on a predicted state of power of the traction battery 2. For this purpose, the VCU 3 communicates with a battery management system 4, which is configured and arranged to predict the state of power of the traction battery 2, the prediction being based on a calculated current of the traction battery 2.

The battery management system 4 comprises a computing unit 5 which is configured and arranged to execute a first computing program. The first computing program comprises instructions to perform the method steps for calculating the current shown in FIG. 2: calculating a diffusion factor in step S10; calculating a current based on an inverted single-particle model in step S20; verifying the calculated current in step S30; updating input parameters B and ΔSOC of the inverted single-particle model in step 40; and in step S50, repeating the steps of calculating and verifying if the step S30 of verifying indicates that recalculation of the current is required.

Referring to FIG. 2, the first computing program performs a preparation step (not shown in FIG. 2) preparing input data in a step preceding the step S10. Input data of the calculation program are a battery resistance R and an associated angular frequency ω, a state of charge SOC of the traction battery 2, an initial voltage $U_{ini}$, a battery temperature $T_{Bat}$, a current direction, a pulse length Δt and a desired voltage $U_{tar}$.

The pulse length Δt and the voltage $U_{tar}$ represent target values, for which the calculation program calculates the current $I_{ges}$ which can be provided by the traction battery 2. The other input data represent boundary conditions which influence the available current $I_{ges}$.

Here, the computing unit 5 of the battery management system 4 includes a second computing program that includes instructions to calculate the battery state $SOH_R$. In this regard, the second computing program determines a battery resistance R, and an angular frequency ω as battery model parameters for a single-particle model used to calculate the battery state $SOH_R$. Battery state $SOH_R$ and battery model parameters R, w are passed by the second calculation program to the first calculation program.

In the preparation step, the first calculation program first processes the input data in such a way that it can use them to calculate the current $I_{ges}$. In addition, it checks the input data with regard to its value range and format. If the first calculation program cannot process the input data due to an invalid value range or an invalid format, an error signal is output and the calculated current $I_{ges}$ and the state of power of the traction battery 2 are set to zero.

When the first calculation program has successfully performed the preparation step, it starts the calculation of the diffusion factor 8 in step S10. The diffusion factor B is an indicator for a transitory shift of the SOC for the considered pulse length Δt. The first computing program calculates the diffusion factor β in step S10 for the given pulse length Δt before the actual calculation of the current $I_{ges}$. The calculation is performed according to the following equation:

$$\beta = \frac{f_1 * \Delta t}{1 + f_2 * \omega * \frac{\Delta t}{2}} + \beta_{prev} * \frac{1 - f_2 * \omega * \frac{\Delta t}{2}}{1 + f_2 * \omega * \frac{\Delta t}{2}},$$

where $f_1$ and $f_2$ are factors, w an angular frequency of the traction battery 2, Δt the given pulse length and $\beta_{prev}$ an initial diffusion factor.

After calculating the diffusion factor B in step S10, the first computing program performs the calculation of the current $I_{ges}$ in step S20 based on an inverted single-particle model.

A single-particle model is used in the normal, i.e. non-inverted, formulation to calculate a voltage of the traction battery 2. The single-particle model uses Fick's law to determine diffusion, determines an open-circuit voltage OCV based on a map stored in the calculation unit 5, considers contact resistance and charge transfer, and the electrodes are approximated as circular particles.

To run the single-particle model, the battery model parameters R and w have to be determined. This is done here by the second computing program, which passes the battery model parameters R, w to the first computing program.

The first computing program uses the single-particle model in an inverted form and calculates a section-wise current I of the traction battery 2 according to the following equation:

$$I = \frac{U_{tar} - U_{ini}}{b * (\Delta t + \beta_{max}) + R},$$

where $U_{tar}$ is the desired voltage, $U_{ini}$ the initial voltage, b a linearization factor and $\beta_{max}$ a maximum diffusion factor for the considered pulse length $\Delta t$.

The initial voltage $U_{ini}$ is determined by the first calculation program based on the state of charge SOC of the traction battery 2. The linearization factor b is obtained by the first calculation program by linearizing a curve of the open-circuit voltage OCV provided. The linearization is performed by the first calculation program in such a way that the deviation between the linearization and the actual curve of the OCV is as small as possible. To calculate the current I, the first program uses the linearization factor b which corresponds to the state of charge SOC.

The first computing program calculates a section-by-section current I of the traction battery 2 for each section resulting from the linearization by iteratively executing the inverted single-particle model.

After calculating the current I, the first calculation program performs the step S30 of verifying the calculated current I. For this purpose, it determines whether the used section of the linearized state of charge SOC of the pulse length $\Delta t$ is exceeded by calculating a time interval $\Delta t^*$ according to the following equation:

$$\Delta t^* = \frac{\Delta SOC}{I} - \beta_{max},$$

where $\Delta SOC$ is a difference between an actual state of charge of the traction battery 2 and a maximum or minimum state of charge in the considered linearization section. Whether the maximum or minimum state of charge is used depends on the current direction, i.e., whether the traction battery 2 is charged or discharged.

If the time span $\Delta t^*$ is greater than the pulse length $\Delta t$ the considered linearization section is not exceeded and the calculated current I is valid. If the time span $\Delta t^*$ is smaller than the pulse length $\Delta t$ the considered linearization section is exceeded and for a following linearization section an update of parameters in step S40 is performed.

Before the parameter update in step S40, the first calculation program still performs a calculation of the time actually spent in a linearization section $\Delta t_{act}$ according to the following formula:

$$\Delta t_{act} = \frac{\Delta SOC}{I} - \beta_{act},$$

where $\beta_{act}$ is a diffusion factor corresponding to an actual diffusion factor in the considered linearization section.

The step S40 of updating parameters includes recalculating initial voltage $U_{ini}$, taking into account a change of $\Delta SOC$ due to a charging or discharging process, redetermining the linearization factor b factor based on the recalculated initial voltage $U_{ini,n}$ and determining the remaining pulse length $\Delta t_n$ by subtracting the time spent in the preceding linearization section $\Delta t_{act}$.

Based on the updated parameters in step S40, the first calculation program repeats steps S20 and S30 and again calculates the current for the considered linearization section, now according to the following equation:

$$I = \frac{U_{tar} - U_{in,in}}{b_n * (\Delta t_n + \beta_{max}) + R}.$$

For the recalculated current I, the first calculation program also verifies in step S30 again whether the considered linearization section is exceeded by the pulse length $\Delta t$. The first calculation program performs the step S40 of updating parameters of the inverted single-particle model and the step S50 of repeating step S20 of calculation and the step S30 of verification until the considered linearization section is no longer exceeded by the pulse length $\Delta t$.

When the first calculation program has determined and verified the currents I for all linearization sections, it calculates a current that can be provided by the traction battery 2 $I_{ges}$ by a weighted averaging of the currents I calculated for the linearization sections. For weighting, the actual time spent in each linearization section $\Delta t_{act}$ is used.

In a further intermediate step, the first calculation program takes into account a limitation S60 of the total current $I_{ges}$ which is preset for the traction battery 2.

In a final step S70, the first computing program predicts the state of power of the traction battery 2 based on the calculated total current $I_{ges}$. Finally, the battery management system 4 transmits the predicted state of power to the VCU 3, which uses the predicted state of power to control the power flow in the vehicle 1.

In an alternative embodiment not shown, the battery management system 4 is configured and arranged to control the traction battery 2 based on the predicted state of power. This may be in addition or as an alternative to communicating the predicted state of power to the VCU. By controlling the traction battery 2 based on the predicted state of power, for example, an overload of the traction battery 2 or an excessive discharge can be avoided.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A battery management system for an accumulator, wherein the battery management system is configured and arranged to:
 calculate a diffusion factor;
 calculate a current based on an inverted single-particle model; and
 predict a state of power of the accumulator, wherein the prediction is based on the calculated current.

2. The battery management system according to claim 1, wherein the battery management system is configured and arranged to iteratively solve the inverted single-particle model to calculate the current.

3. The battery management system according to claim 1, wherein the battery management system is configured and arranged to use a voltage and a pulse length as inputs for the inverted single-particle model.

4. The battery management system according to claim 2, wherein the battery management system is configured and arranged to perform the following steps in iteratively solving the inverted single-particle model:
 calculating the current based on the inverted single-particle model;
 verifying the calculated current; and
 updating parameters of the inverted single-particle model and repeating the steps of calculating and verifying, if the step of verifying indicates that recalculating the current is required.

5. The battery management system according to claim 1, wherein the accumulator is implemented as a lithium-ion accumulator.

6. The battery management system according to claim 1, wherein the battery management system is configured and arranged to control the accumulator based on the predicted state of power.

7. A method for predicting a state of power of an accumulator, comprising the steps of:
 calculating a diffusion factor;
 calculating a current based on an inverted single-particle model;
 verifying the calculated current;
 updating parameters of the inverted single-particle model and repeating the steps of calculating and verifying, if the step of verifying indicates that recalculating the current is required.

8. A controller for controlling a power flow of an accumulator, the controller being configured and arranged to control the power flow based on a predicted state of power, wherein the controller is configured and arranged to determine the predicted state of power according to a method according to claim 7.

* * * * *